United States Patent

Capasso et al.

[11] Patent Number: 6,055,254
[45] Date of Patent: Apr. 25, 2000

[54] QUANTUM CASCADE LIGHT EMITTER WITH PRE-BIASED INTERNAL ELECTRONIC POTENTIAL

[75] Inventors: Federico Capasso, Westfield; Alfred Yi Cho, Summit; Claire F. Gmachl, Millburn; Albert Lee Hutchinson, Piscataway; Deborah Lee Sivco, Warren; Alessandro Tredicucci, Summit, all of N.J.

[73] Assignee: Lucent Technologies Inc., Murray Hill, N.J.

[21] Appl. No.: 09/159,127

[22] Filed: Sep. 23, 1998

[51] Int. Cl.[7] .............................. H01S 3/18; H01S 3/19
[52] U.S. Cl. ................................................ 372/45; 372/43
[58] Field of Search .................................. 372/45, 46, 43, 372/44; 385/123

[56] References Cited

U.S. PATENT DOCUMENTS

| | | | |
|---|---|---|---|
| 5,457,709 | 10/1995 | Capasso et al. | 372/45 |
| 5,502,787 | 3/1996 | Capasso et al. | 385/123 |
| 5,509,025 | 4/1996 | Capasso et al. | 372/45 |
| 5,936,989 | 8/1999 | Capasso et al. | 372/45 |

OTHER PUBLICATIONS

T. Nakagawa et al., "New Negative–Resistance Device By a Chirp Superlattice"..., Electron. Lett., vol. 19, No. 20, pp. 822–823 (Sep. 1983).

T. Nakagawa et al., Superlattices and Microstructures, "Design Principles for Chirp Superlattice Devices", vol. 1, No. 2, pp. 187–192 (1985) (no month).

T. Nakagawa et al., "Observation of Negative Differential Resistance in Chirp Superlattices"..., Electron. Lett., vol. 21, No. 19, pp. 882–884 (Sep. 1986).

C. J. Summers et al., "Variably spaced superlattice energy filter a new device concept for high–energy electron injection"..., Appl. Phys. Lett., vol. 48, No. 12, pp. 806–808 (Mar. 1986).

G. Scamarcio et al., "High–Power Infrared (8–Micrometer Wavelength) Superlattice Lasers"..., Science, vol. 276, pp. 773–776 (May 1997).

A. Tredicucci et al., "High–power inter–miniband Lasing in Intrinsic Superlattices"..., Appl. Phys. Lett., vol. 72, No. 19, pp. 2388–2390 (May 1998).

M. Beck et al., "Buried heterostructure Quantum Cascade Lasers"..., Proc. SPIE, vol. 3284, pp. 231–236 (1998) (no month).

C. Gmachl et al., "High–power $\lambda = 8\ \mu m$ Quantum Cascade Lasers with near Optimum Performance"..., Appl. Phys. Lett., vol. 72, No. 24, pp. 3130–3132 (Jun. 1998).

*Primary Examiner*—Rodney Bovernick
*Assistant Examiner*—Quyen P. Leung
*Attorney, Agent, or Firm*—Eugen E. Pacher

[57] ABSTRACT

Instead of trying to keep the SLs of a QC laser field free, we "pre-bias" the actual electronic potential by varying the SL period (and hence average composition) so as to achieve an essentially flat profile, on average, of upper and lower minibands, despite the presence of an applied field in the SLs. In one embodiment, in at least a first subset of the QW layers, the thicknesses of the QW layers are varied from QW layer to QW layer so as to increase in the direction of the applied field. In this embodiment, the upper and lower lasing levels are located, in the absence of an applied electric field, each at different energies from layer to layer within the first subset, so that despite the presence of an applied field, the desired flatband condition of the upper and lower minibands is realized. In a preferred embodiment, the thicknesses of the QW layers within the first subset are varied from QW layer to QW layer so as to increase in the direction of the applied field, and the thicknesses of a second subset of the barrier layers are also varied from barrier layer to barrier layer so as to decrease or increase in the direction of the applied field.

12 Claims, 4 Drawing Sheets

QUANTUM CASCADE LIGHT EMITTER WITH PRE-BIASED INTERNAL ELECTRONIC POTENTIAL

GOVERNMENT CONTRACTS

This invention was made with Government support under Contract No. DAAH04-96-C-0026 and Contract No. DAAG55-98-C-0050, both awarded by the DARPA/US Army Research Office. The Government has certain rights in this invention.

FIELD OF THE INVENTION

This invention relates generally to superlattice (SL) semiconductor devices and, more particularly, to quantum cascade (QC) SL semiconductor light emitters (e.g., lasers).

BACKGROUND OF THE INVENTION

Semiconductor SLs are multi-layered structures with unique electronic properties. These structures comprise a periodic stack of alternating thin (e.g., nanometer thick) layers of two different semiconductor materials having different bandgaps (i.e., lower bandgap quantum well (QW) layers interleaved with wider bandgap barrier layers). As described by G. Scamarcio et al., Science, Vol. 276, pp. 773–776 (May 1997), the period of this structure (~5 nm) is typically much larger than the lattice constant of the bulk crystalline constituents (~0.5 nm). This superimposed potential splits the conduction and valence bands into a series of much narrower bands (typically tens to a few hundred millielectron volts wide in the strong tunnel-coupling regime) called minibands, which are separated by energy gaps (minigaps) along the direction perpendicular to the layers. To form a miniband requires that the wavefunctions of the states in each of the QWs are delocalized; i.e., the wavefunctions extend over many QWs, thus indicating that the QWs are strongly coupled to one another; they are not localized in which case the QWs would be effectively decoupled from one another.

An interesting feature of SLs, their long inter-miniband relaxation time compared to the intra-miniband one, has been used to develop an SL QC laser with intrinsic population inversion and very large current carrying capabilities and optical power outputs. In these QC lasers the active region repeat units (radiative transition (RT) regions plus interleaved injection/relaxation (I/R) regions) are formed by SLs. See, for example, Scamarcio et al., supra, and A. Tredicucci et al., Appl. Phys. Lett., Vol. 72, No. 19, pp. 2388–2390 (May 1998), both of which are incorporated herein by reference. In both cases laser action in each RT region was achieved between minibands through unipolar (electron) injection by miniband transport through each I/R region. The vertical laser transition, between energy states at the bottom of an upper conduction miniband and empty states near the top of a lower conduction miniband, took place at a photon energy well below the energy band gap of the barrier and QW materials. The center wavelength of these QC SL lasers is determined by the minigap and can be selected over a large region of the IR spectrum by changing the barrier and QW thicknesses.

In order for QC SL lasers to properly function a flatband condition of the minibands must exist; i.e., two conditions should be met: (1) macroscopic alignment of the RT and I/R regions with one another, and (2) microscopic alignment of the upper and lower laser energy levels across the RTs. However, in the presence of the applied field (e.g., the external bias applied transverse to the layers to induce lasing) the quantum states, from QW layer to QW layer, shift to higher and higher energies in the direction of the field. In the Scamarcio et al. QC SL laser this problem was addressed by heavily doping the entirety of all of the RT regions so that the dopant ions and corresponding extrinsic electrons produced a screening field which compensated the applied field (i.e., prevented significant field penetration into the active region). On the other hand, in the Tredicucci et al. QC SL laser, only the ends of the I/R regions close to the RT regions were doped. Here, the dopant ions and their extrinsic electrons acted like opposing plates of a capacitor to screen the applied field. In this fashion, the SL regions were almost field free, with the upper miniband of each repeat unit aligned with the lower miniband of the previous, adjacent unit (in the direction of electron flow). However, the relatively high concentration of extrinsic electrons (sheet density per period of $7-8\times10^{11}$ cm$^{-2}$ in the Tredicucci et al. laser) resulted in high absolute values of threshold current as well as rapidly increasing threshold current with increasing temperature.

Thus, a need remains in the QC SL laser art for a design which achieves the desired flatband condition of the upper and lower minibands without requiring essentially field-free SLs; e.g., without the need to introduce dopants to compensate the applied field.

SUMMARY OF THE INVENTION

In accordance with one aspect of our invention, instead of trying to keep the SLs of a QC laser field free, we "pre-bias" the actual electronic potential by varying the SL period (and hence average composition) so as to achieve an essentially flat profile, on average, of upper and lower minibands, despite the presence of an applied field in the SLs. The definition of the term "pre-bias" will be more fully developed hereinafter. For example, in one embodiment, in at least a first subset of the QW layers, the thicknesses of the QW layers are varied from QW layer to QW layer so as to increase in the direction of the applied field. In this embodiment, the upper and lower lasing levels are located, in the absence of an applied electric field, each at different energies from layer to layer within the first subset, so that despite the presence of an applied field, the desired flatband condition of the upper and lower minibands is realized. In a preferred embodiment, the thicknesses of the QW layers within the first subset are varied from QW layer to QW layer so as to increase in the direction of the applied field. In another embodiment, the thicknesses of a second subset of the barrier layers are also varied from barrier layer to barrier layer within the second subset so as to vary (either increase or decrease) in the direction of the applied field.

The principles of our invention are, of course, applicable to QC SL light emitters in general and specifically to spontaneous emission light emitters as well as lasers.

In accordance with yet another aspect of our invention, a method of making a QC SL light emitter comprises the steps of: (1) fabricating a multiplicity of SL unipolar RT regions interleaved with I/R regions, each RT region including a plurality of QW layers interleaved with barrier layers, the QW layers having energy states characterized by upper and lower minibands, and (2) in at least a first subset of the QW layers, increasing the thicknesses of the QW layers from QW layer to QW layer in a first direction transverse to the layers. An alternative embodiment includes the additional step of, in at least a second subset of barrier layers, varying (decreasing or increasing) the thicknesses of the barrier layers from barrier layer to barrier layer in the same direction, so that despite the presence of an applied field within the SLs, the desired flatband condition of the upper and lower minibands is realized.

BRIEF DESCRIPTION OF THE DRAWING

Our invention, together with its various features and advantages, can be readily understood from the following more detailed description taken in conjunction with the accompanying drawing, in which.

In the interest of clarity and simplicity, FIGS. 1–4 have not been drawn to scale. In addition, when describing physical or optical dimensions, the symbol A stands for Angstroms, whereas when describing electric current, it stands for Amperes.

DETAILED DESCRIPTION OF THE INVENTION

Figure 1:
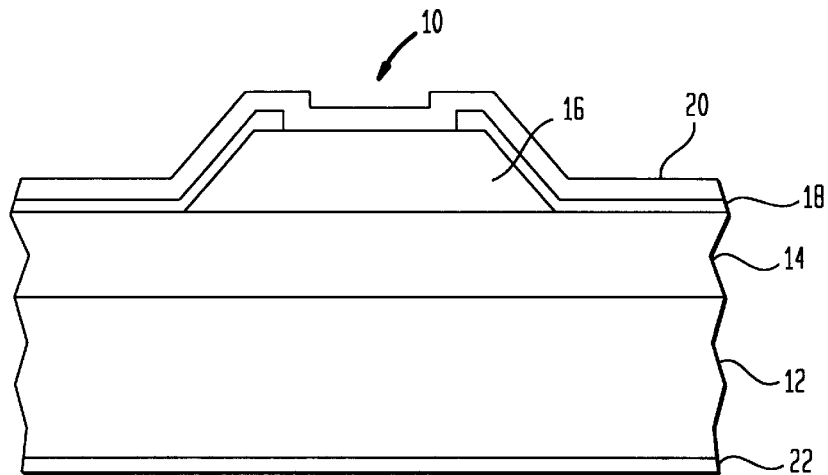
FIG. 1 is a schematic, cross-sectional view of a QC SL laser in accordance with one embodiment of our invention.

With reference now to FIG. 1, a QC SL semiconductor light emitter (e.g., laser) 10 comprises a QC SL active region 14 sandwiched between an upper cladding region 16 and a substrate 12 which serves as a lower cladding region. Alternatively, a lower cladding region, separate from the substrate, may be formed between the substrate and the active region. The upper cladding region 16 is illustratively formed in the shape of a mesa or trapezoid typical of ridge waveguide laser structures. The mesa may be shallow-etched as shown to stop at the active region 14, or it may be deep-etched so that the mesa extends into the active region. In either case, an electrically insulating layer 18 (e.g., $Si_3N_4$ or $SiO_2$) is formed over the top of the device and is patterned to form an opening which exposes a portion of the top of the mesa. A first electrode 20 is formed over the insulating layer 18 and in the opening so as to contact the upper cladding region (usually by means of a highly doped contact-facilitating layer, not shown), and a second electrode 22 is formed on the substrate 12.

The substrate itself may be a single crystal semiconductor body or a combination of such a body with another layer (e.g., an epitaxial layer grown on the top surface of the body). Illustratively, lasers of this type are fabricated from Group III-V compound semiconductors; e.g., In-based Group III-V compounds such as GaInAs and AlInAs.

Drive circuitry, not shown, is coupled across the electrodes in order to provide an external voltage bias and to supply pumping energy to the laser of sufficient magnitude to generate light. Below threshold the emitter operates as an incoherent, spontaneous emission source, whereas above threshold it operates as a coherent, stimulated emission source. In the latter case, when provided with optical feedback, the source functions as laser. Suitable optical feedback is typically provided by an optical cavity resonator formed, for example, by cleaved crystal facets, distributed feedback (DFB)gratings, and distributed Bragg reflectors (DBRs), or a combination of them.

Figure 2:
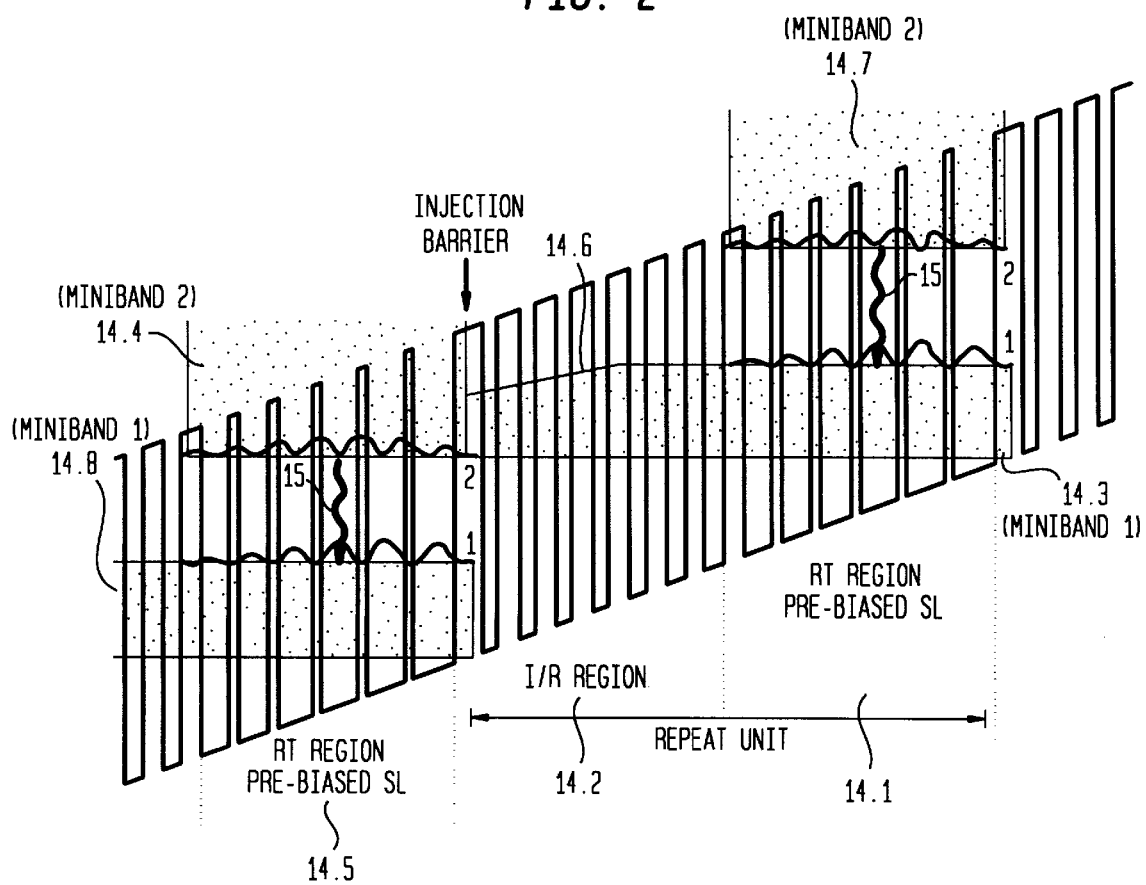
FIG. 2 is a schematic, conduction band profile of two SL regions bridged by an I/R region at a design electric field of 45 kV/cm.

In accordance with one aspect of our invention as shown in FIG. 2, the active region 14 includes a multiplicity of N repeat units, each unit comprising a "pre-biased" SL RT region 14.1 and an I/R region 14.2. The effect of "pre-biasing" the internal electronic potential of the SLs is to produce a flatband condition of upper and lower minibands despite the presence of the electric field in the SLs produced by the applied bias voltage. More specifically, the lower miniband 14.3 of one RT region 14.1 is aligned with the upper miniband 14.4 of an adjacent RT region 14.5, with the two aligned minibands being matched to and bridged by a single miniband 14.6 of the intervening I/R region 14.2. In this type of device lasing is an inter-miniband process; i.e., as shown by the wavy arrow 15, stimulated emission at a wavelength λ takes place in RT region 14.1 between the bottom energy level 2 of the upper miniband 14.7 and the top energy level 1 of the lower miniband 14.3. A similar process takes place in the other RT regions. For example, lasing also takes place at the same wavelength in RT region 14.5 between the bottom energy level 2 of upper miniband 14.4 and top energy level 1 of lower miniband 14.8. The wavefunctions (moduli squared) of the levels 1 and 2 are also shown in FIG. 2. Note that within each RT these wavefunctions extend across all of the QWs of that RT, thus indicating that the QWs are effectively coupled to one another.

The internal electronic potential of an RT region is pre-biased in the sense that an actual potential is built into the device; i.e., the energy levels of at least a first subset of the QW layers of the RT region are staggered from QW layer to QW layer. In one embodiment, "pre-biasing" is achieved by monotonically increasing the thicknesses of these QW layers in a first direction transverse to the layers; e.g., in the direction of the applied electric field (generated by the bias voltage). In a preferred embodiment, the thicknesses of a second subset of the barrier layers may also be varied form barrier layer to barrier layer. Preferably, the thicknesses of these barrier layers monotonically decrease or increase in the same first direction. The term subset is intended to embrace fewer than all of the QW (or barrier) layers in the RT region or all of the QW (or barrier) layers in the RT region (i.e., the complete set). Moreover, the first and second subsets need not embrace the same group of layers and need not contain the same number of layers.

Figure 3:
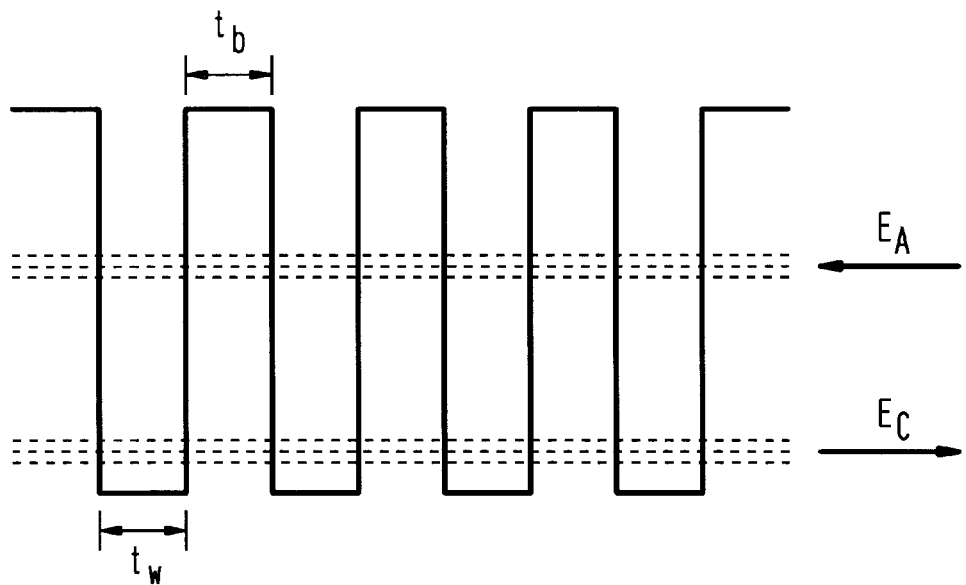
FIG. 3 is a schematic, conduction band profile showing a typical flatband condition of the minibands in the presence of an applied electric field which might be achieved in the prior art by, for example, introducing dopants to screen (or compensate) the applied field.
Figure 4:
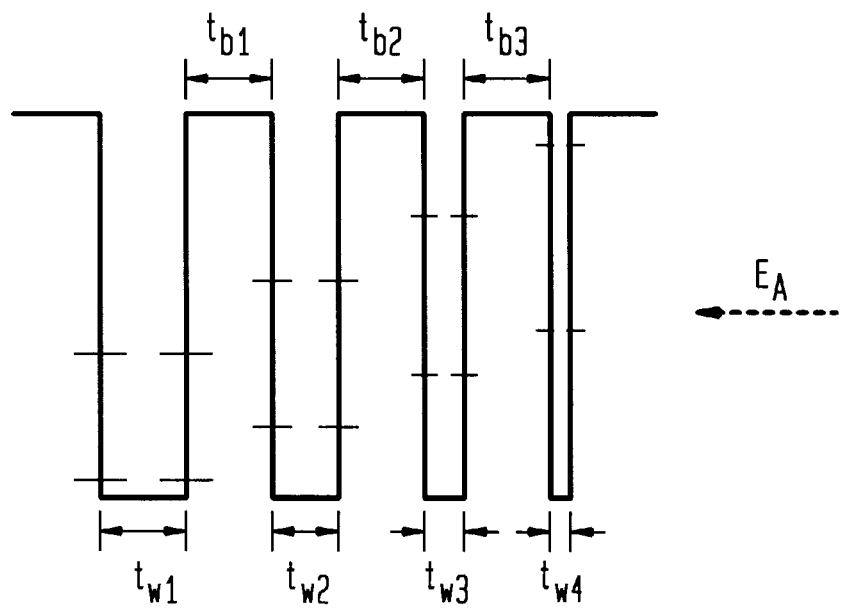
FIG. 4 is a schematic, conduction band profile of a "pre-biased" SL in the absence of an applied electric field in accordance with one embodiment of our invention.

To better understand how the "pre-biased" SL RT regions provide for the desired flatband condition of the upper and lower conduction minibands, we turn to FIGS. 3 and 4. The desired flatband condition of the minibands 30,40 in an SL in the presence of an applied field $E_A$ is depicted in FIG. 3. Here, the SL is shown as a typical prior art, field-compensated periodic structure in which each QW layer has the same thickness $t_w$ and each barrier layer has the same thickness $t_b$. Without some form of compensating field $E_C$, however, each miniband of FIG. 3 would be split into separate quantum states at different energies in each quantum well. We take advantage of this effect by building into the SL quantum states which, in the absence of an applied field, are staggered in such a way that, in the presence of an applied field, the states are aligned with one another. Thus, in accordance with one embodiment of our invention as shown in FIG. 4, an SL is "pre-biased" by increasing the QW layer thickness $t_w$ in the direction of the electric field $E_A$ (shown in phantom since it would be applied only during the operation of the laser). Thus, for example, $t_{w4} < t_{w3} < t_{w2} < t_{w1}$, which means that the quantum states in the narrower QWs are at higher energies than the corresponding states in the wider QWs, and that the energy difference between the upper and lower levels in the narrower QWs is larger than in the wider QWs. Therefore, by grading the thicknesses of the QWs we are able to stagger the quantum states from QW to QW in such a way that the desired flatband condition of the upper and lower minibands is realized.

We note here that in relatively short SLs a desired flat miniband condition of upper and lower minibands can be achieved by varying only the QW thicknesses as previously described. In longer SLs, however, is preferable to vary both the QW and barrier layer thicknesses; that is, in accordance with another embodiment of our invention, we preferably also vary (increase or decrease) the barrier thickness the direction of the applied field. Whether or not the thicknesses of a particular subset of barrier layers is increased or decreased is determined empirically (including the use of computer modeling programs). Objectives of varying tb include ensuring adequate coupling of the QWs, facilitating electron transport between the QWs, and providing relatively high oscillator strength (i.e., dipole matrix element $z_{21}$). In any case, the period defined by $(t_w + t_b)$ should not vary so widely that the SL characteristics of the RT regions are significantly impaired.

To date our best output power results were achieved in a QC SL in which the thicknesses of a subset of the barrier layers decreased in the direction of the applied field. But, the best threshold current density results were obtained in a QC SL laser in which the thicknesses of a subset of the barrier layers increased in the direction of the applied field. Examples of both of these lasers are discussed below.

EXAMPLE

This example describes a Group III-V compound semiconductor, QC "pre-biased" SL laser in accordance with one embodiment of our invention. Various materials, dimensions and operating conditions are provided by way of illustration only and, unless otherwise expressly stated, are not intended to limit the scope of the invention. As used herein, the term undoped means that a particular semiconductor layer or region is not intentionally doped; i.e., any doping of such a region or layer is relatively low and typically results from residual or background doping in the chamber used to grow the layers of the device.

The schematic conduction band diagram of the lasers is shown in FIG. 2. Two well-defined minibands 14.3 and 14.4 were obtained in the adjacent "pre-biased" SL RT regions 14.1 and 14.5, respectively, matched to a single I/R miniband 14.6 which bridges them together across the cascading stages. The states involved in the lasing transitions, at a center wavelength of about 7.2 μm between the upper and lower minibands in each RT region, were uniformly delocalized over at least six periods of each SL, which ensured a large dipole matrix element $z_{21} = 2.7$ nm. Their lifetimes through optical phonon emission were computed to be $\tau_2 \sim 1$ ps and $\tau_1 \sim 0.1$ ps, with a scattering time $\tau_{21} = 5.3$ ps.

Two identical GaInAs/AlInAs samples, each with N=28 repeat units (RT plus I/R regions), were grown by molecular beam epitaxy (MBE) lattice-matched to a low doped InP substrate. The complete structure, shown in Table I, included a core sandwiched between the substrate and an upper cladding region but separated therefrom by well known GaInAs/AlInAs digitally graded transition layers. The core included the 28 repeat units bounded by relatively thick, low doped GaInAs layers. A thin, highly doped GaInAs contact-facilitating layer was formed on top of the upper cladding region. The substrate itself served as a lower cladding region.

The wafers were processed into mesa-etched ridge waveguide lasers of several widths and cleaved into bars typically about 2–3 mm long, with the laser output facets left uncoated. In some applications, however, it may be desirable to coat the facets, as is well known in the art.

TABLE I

| QC Laser Structure | Composition | Doping Concentration ($cm^{-3}$) | Thickness (Å) |
|---|---|---|---|
| Contact-facilitating | GaInAs | $n = 1 \times 10^{20}$ | 100 |
| Cladding | GaInAs | $n = 7 \times 10^{18}$ | 5000 |
| Cladding | Digitally Graded | $n = 2 \times 10^{17}$ | 300 |
| Cladding | AlInAs | $n = 2 \times 10^{17}$ | 10000 |
| Cladding | AlInAs | $n = 1 \times 10^{17}$ | 12000 |
| | Digitally Graded | $n = 1 \times 10^{17}$ | 300 |
| Core | GaInAs | $n = 5 \times 10^{16}$ | 3300 |
| Core (Repeat Unit; N = 28) | I/R region "Pre-biased" RT region | $n = 2 \times 10^{17}$ undoped | 302 375 |
| Core | Digitally Graded | $n = 2 \times 10^{17}$ | 302 |
| Core | GaInAs | $n = 5 \times 10^{16}$ | 5000 |
| | Digitally Graded | $n = 1 \times 10^{17}$ | 250 |
| Substrate | InP | $n = 1–4 \times 10^{17}$ | — |

The details of each of the conventional GaInAs/AlInAs I/R regions are shown in Table II.

TABLE II

| I/R Region Composition | Doping Concentration (cm$^{-3}$) | Thickness (A) |
|---|---|---|
| GaInAs | undoped | 23 |
| AlInAs | undoped | 25 |
| GaInAs | 2 × 10$^{17}$ | 23 |
| AlInAs | 2 × 10$^{17}$ | 25 |
| GaInAs | 2 × 10$^{17}$ | 22 |
| AlInAs | 2 × 10$^{17}$ | 26 |
| GaInAs | 2 × 10$^{17}$ | 20 |
| AlInAs | 2 × 10$^{17}$ | 26 |
| GaInAs | undoped | 19 |
| AlInAs | undoped | 27 |
| GaInAs | undoped | 19 |
| AlInAs | undoped | 29 |
| GaInAs | undoped | 18 |
| AlInAs | undoped | 35 |

Table III shows the varying layer thicknesses of the "pre-biased" RT regions for both samples D2369 and D2404, in accordance with one embodiment of our invention. The applied electric field (not shown) would be oriented in the upward direction; i.e., from the bottom to the top of table. Consistent with our previous discussion the thicknesses of the six GaInAs QW layers increased monotonically from 35 A to 51 A in the direction of the field. In this example, therefore, the subset of graded QW layers is the complete set, but as noted before the subset could include fewer than all of the QW layers in each RT region. In contrast, the thicknesses of only the bottom most subset of four AlInAs barrier layers is varied, in this case monotonically decreased in the direction of the field as follows: 25 A, 13 A, 12 A, 11 A. The bottom most 25 A barrier could be thinner (e.g., 14 A), but was optionally designed thicker so as provide a degree of decoupling of the RT region from the adjacent I/R region. On the other hand, the topmost subset of four barrier layers all had a thickness of 11 A.

TABLE III

| "Pre-biased" RT Region Composition | Thickness (A) |
|---|---|
| GaInAs | 51 |
| AlInAs | 11 |
| GaInAs | 48 |
| AlInAs | 11 |
| GaInAs | 44 |
| AlInAs | 11 |
| GaInAs | 41 |
| AlInAs | 12 |
| GaInAs | 38 |
| AlInAs | 13 |
| GaInAs | 35 |
| AlInAs | 25 |

Figure 5:
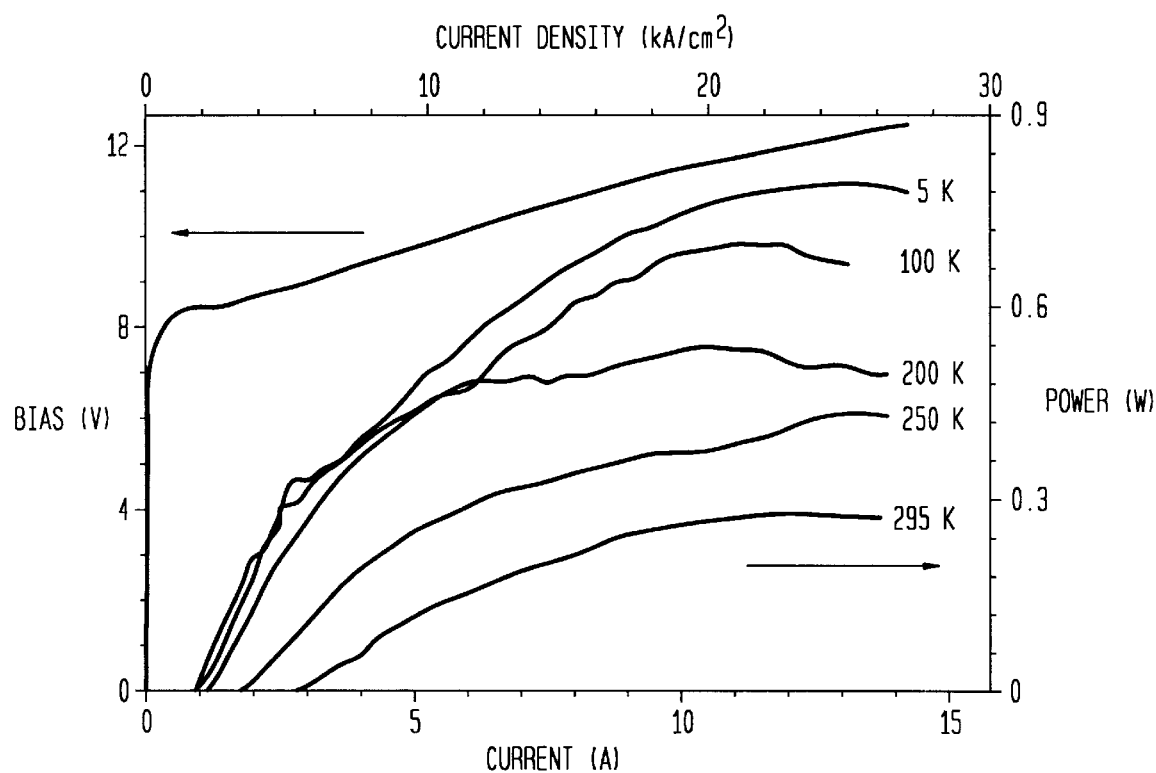
FIG. 5 shows a family of the light-current (L-I) characteristics at different temperatures (5 K to 295 K) of a QC SL laser in accordance with one embodiment of our invention. The data were recorded using f/0.8 optics and a calibrated room temperature HgCdTe detector to detect the output from a single laser facet with approximately 50% collection efficiency. The laser (3 mm long and 17.7 µm wide) designed in accordance with one embodiment of our invention, was driven in a pulsed mode (50 ns pulse width and 5 kHz repetition rate), with the measurements performed using an adjustable gated averager. The current-voltage (I-V) characteristic at 5 K is also shown.

The emitted peak power in pulsed operation of a laser from sample D2369 is shown in FIG. 5 as a function of drive current. The ridge waveguide was etched deeply through the 28 stages in order to have a well-defined measure of the active device size and current density. Peak powers of almost 900 mW at 5 K and nearly 300 mW at room temperature were obtained. As one can deduce from the I-V characteristic also plotted in FIG. 5, the voltage at threshold (~8.5 V) corresponds well to the electric field for which the structure was designed. The threshold current density at 5 K, $J_{th}=1.5$ kA/cm$^2$, was almost a factor of three better than that of any previously published inter-miniband SL laser (See, Tredicucci et al., supra.) and is comparable to that of conventional inter-subband QC lasers of similar wavelength of operation (See, C. Gmachl et al., Appl. Phys. Lett., Vol. 72, No. 24, pp. 3130–3132 (June 1998), which is incorporated herein by reference.). The room temperature value was $J_{th}=5.2$ kA/cm$^2$. However, even lower room temperature threshold current densities were obtained in a QC SL laser from sample D2394 in which the thicknesses of a first subset of the QW layers increased in the direction of the applied field, as before, but the thicknesses of a second subset of the barrier layers also increased in the same direction. In sample D2394 the thicknesses of six barrier layers increased from 7 A to 12 A in 1 A increments, but the bottom most barrier layer (nearest the 7 A barrier layer) was 25 A thick to provide decoupling of the RT and I/R regions, as described above.

Figure 6:
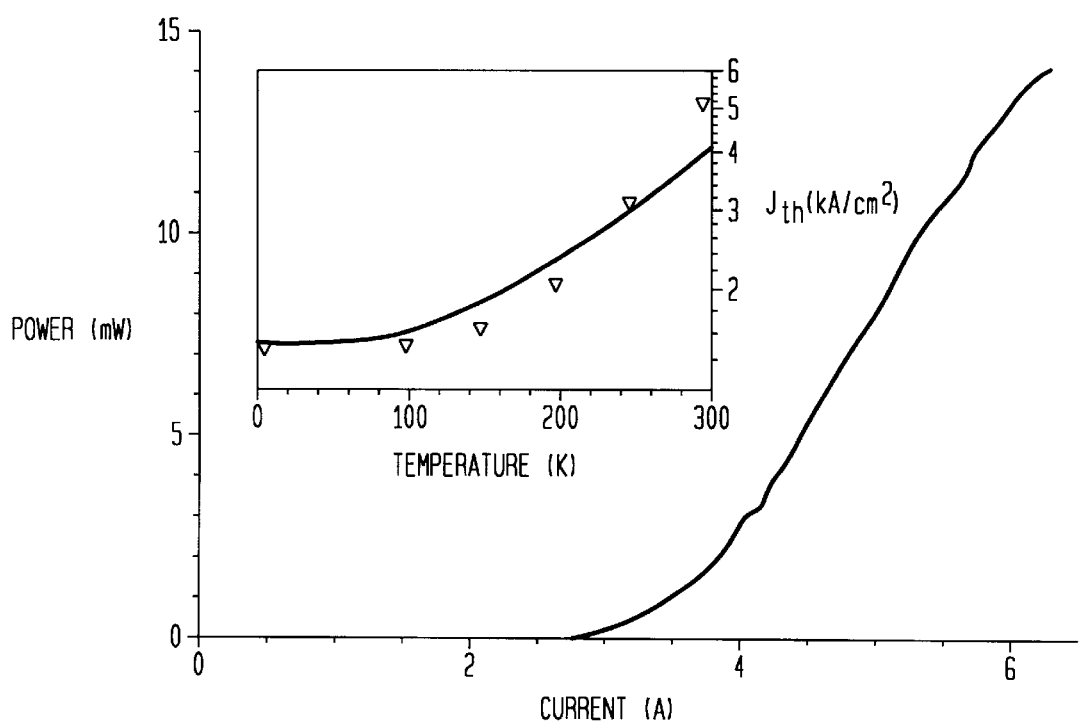
FIG. 6 shows the average emitted optical power at room temperature from a single facet of a QC SL laser as measured with near-unity collection efficiency, in accordance with another embodiment of our invention. The laser (3 mm long and 14.2 µm wide) from sample D2404 was driven by current pulses of 100 ns duration at 5% duty-cycle. The inset shows the measured threshold current densities of laser of FIG. 5 together with the theoretical curve.

The measured dependence of the threshold current density on temperature is plotted in the inset to FIG. 6 for sample D2369. The finite temperature behavior was estimated by adding to the well known formula for $J_{th}$ of QC lasers a term that takes into account the thermally activated population of the lower lasing level (state 1). The threshold current densities so computed are also plotted in the inset to FIG. 6. The agreement with our experimental results is good, considering the uncertainties of the model. The low threshold currents of our lasers are particularly desirable for room temperature operation at high repetition rates, where heat dissipation becomes an issue. As can be seen from FIG. 6, this property, combined with the peak power performance, results in a 14 mW average power achieved at 295 K from a laser obtained from sample D2404. This power was measured with near-unity collection efficiency using a parabolic cone and a conventional thermopile power meter.

Figure 7:
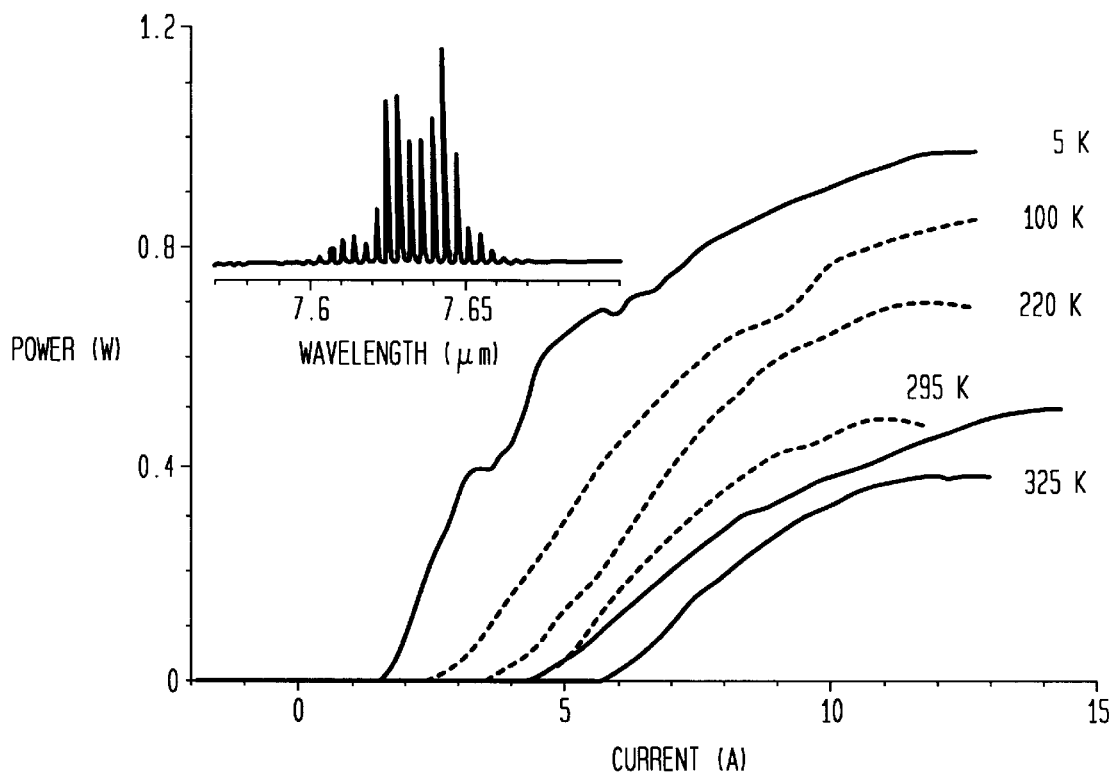
FIG. 7 shows the peak optical power as a function of drive current and at various temperatures, as recorded from a single facet of broad-area lasers from sample D2404 with approximately 50% collection efficiency. Solid and dashed lines refer to two different devices, each ~2.25 mm long. A typical room temperature pulsed spectrum of the laser emission is shown in the inset.

Devices from sample D2404 were also processed in a broad-area configuration as shown in FIG. 1 (rather than as deep etched, narrower mesa, ridge waveguides) by limiting the etching procedure to the cladding layers. These lasers outperformed the standard deep-etched lasers in terms of peak power, as shown in FIG. 7, where the L-I characteristics at various temperatures of two such devices are shown. The value of 0.5 W was obtained at room temperature. The room temperature multi-mode spectrum of the emission of our broad area lasers just above threshold is shown in the inset of FIG. 7.

The limiting factor in the continuous wave (CW) operation of inter-subband and inter-miniband lasers originates from the large power dissipation of the devices. Due to the finite thermal resistance of the lasers, the temperature of the active region is much higher than that of the heat sink. The substrate temperature $T_{sub}$ is a good approximation of the latter, and a typical maximum $T_{sub}$ for CW operation ($T_{sub, max}$) is about 145 K. A reduction in the voltage applied across the active region, which can be achieved by decreasing the number of repeat units (stages), would lead to a higher $T_{sub,max}$, provided that the increase in the current threshold is not too large. We have found that a QC "pre-biased" SL laser with only 19 stages (in a design identical to sample D2369) to be efficacious in this regard. However, 19 stages is illustrative only; more or fewer stages could be used depending on the intended application.

Figure 8:
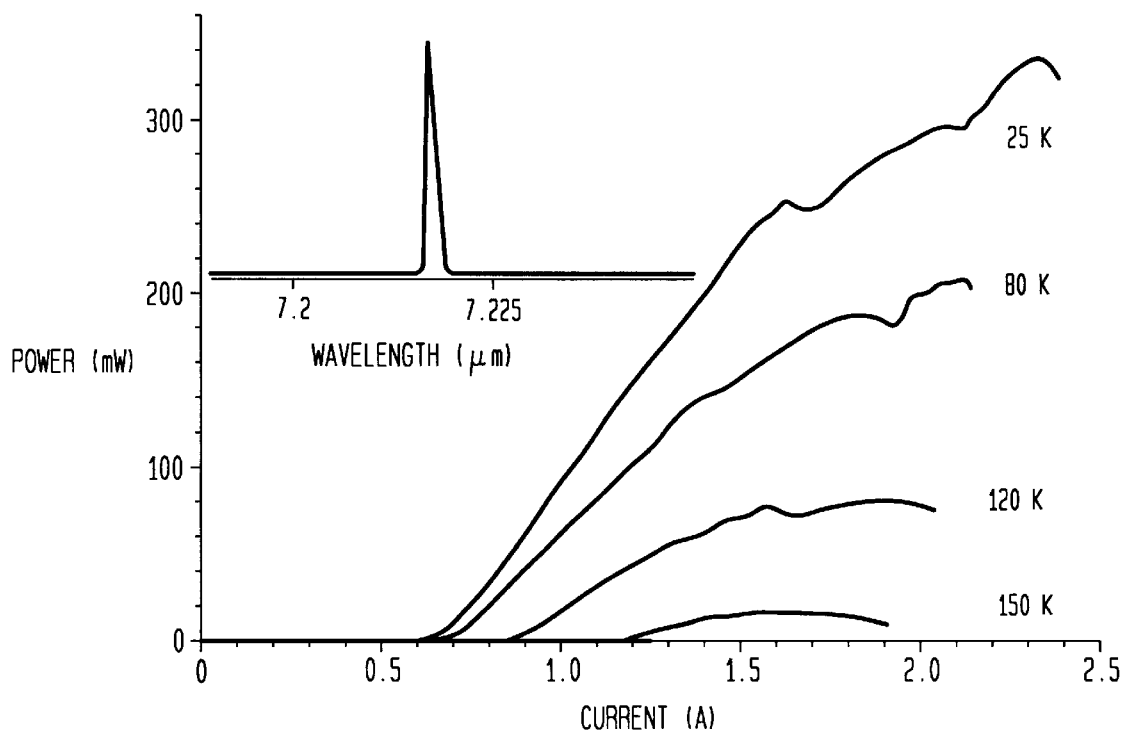
FIG. 8 shows continuous wave L-I characteristics of a laser in accordance with another embodiment of our invention. The laser was 2.26 mm long and 10.8 µm wide from sample D2433, as measured from a single device facet with near-unity collection efficiency. The inset shows a CW spectrum recorded at 20 K just above the laser threshold.

The CW optical power as a function of drive current of one device from wafer D2433 is shown in FIG. 8 for various temperatures. More than 300 mW of optical power was obtained at 25 K, whereas 20 mW was still obtained at 150 K. The laser ceased to operate in a CW mode at a high temperature of 160 K. As shown in the inset of FIG. 8, the CW spectrum at a cryogenic temperature just above threshold was single mode at a center wavelength of about 7.22 μm, in excellent agreement with the computed energy difference between the upper and lower inter-minibands. The higher values of the slope efficiency were obtained for the samples with more than 19 stages, according to the well-known cascading scheme in which each electron injected above threshold emits one photon per stage. A slope efficiency of 478 mW/A was recorded for a 28 stage laser (from wafer D2404) which was 3 mm long and 16.7 um wide. This measured efficiency compared very well with a calculated value 472 mW/A. The resulting external differential quantum efficiency of 5.6 was greater than unity, which is possible only in laser with cascaded active regions.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, two assumptions are implicit in the foregoing: first, that the repeat units are all identical to one another, and second that the external, applied field in each repeat is the same. If the latter is not the case, it may be desirable for the repeat units to have slightly different thickness variations in either the QW or barrier layers, or both. For example, the variations built into the SL (e.g., of QW or barrier layer thickness) need not be linear changes in a device parameter, nor do they have to be monotonic changes. Finally, we note that even though the use of doping schemes to screen the applied field have downsides, it is possible that such schemes may be used in combination with our invention.

What is claimed is:

1. A quantum cascade (QC) superlattice (SL) light emitter comprising:

a core region including a QC active region which comprises a multiplicity of repeat units, each repeat unit including a unipolar radiative transition (RT) SL region and an injection/relaxation (I/R) region, each of said RT SL regions comprising a plurality of quantum well (QW) layers interleaved with a plurality of barrier layers, said QW layers having energy states characterized by upper and lower minibands, and electrodes for applying an electric field to said emitter effective to cause said RT regions to generate light at an energy determined by upper and lower energy levels within said minibands, characterized in that in at least a first subset of said QW layers, the internal electronic potential is pre-biased so that, despite the presence of said applied field in said SLs, an essentially flatband condition of both said upper and lower minibands exists.

2. The invention of claim 1 wherein said upper and lower energy levels are located, in the absence of said applied field, each at different energies from QW layer to QW layer within said first subset, and the energy difference between upper and lower energy levels in the QW layers decreases in the direction of said applied field.

3. The invention of claim 1 wherein the thicknesses of said QW layers within said first subset are varied from QW layer to QW layer.

4. The invention of claim 3 wherein said thicknesses of said QW layers increase in the direction of said applied field.

5. The invention of claim 3 wherein the thicknesses of a second subset of said barrier layers are varied from barrier layer to barrier layer.

6. The invention of claim 5 wherein said thicknesses of said barrier layers within said second subset decrease in the direction of said applied field.

7. The invention of claim 5 wherein said thicknesses of said barrier layers within said second subset increase in the direction of said applied field.

8. The invention of claim 1 wherein said core region comprises layers of In-based Group III-V compound semiconductor layers.

9. The invention of claim 8 wherein said core region comprises layers of GaInAs and layers of AlInAs.

10. A quantum cascade (QC) superlattice (SL) laser comprising:

a core region including a QC active region which comprises a multiplicity of repeat units, each repeat unit including a unipolar radiative transition (RT) SL region and an injection/relaxation (I/R) region, each of said RT SL regions comprising a plurality of quantum well (QW) layers interleaved with a plurality of barrier layers, said QW layers having energy states characterized by upper and lower minibands, a pair of cladding regions bounding said core region, and electrodes for applying an electric field to said laser effective to cause said RT regions to generate laser action at an energy determined by upper and lower energy levels of said QW layers, said upper and lower levels being located within said upper and lower minibands, respectively, and in the presence of said field the upper miniband of one RT region being aligned with the lower miniband of an adjacent RT region and with the miniband of the I/R region disposed therebetween, characterized in that in at least a first subset of said QW layers within each of said RT regions the thicknesses of said QW layers increase from QW layer to QW layer in the direction of said applied field, and in at least a second subset of said barrier layers within each of said RT regions the thicknesses of said barrier layers vary from barrier layer to barrier layer in the direction of said applied field, so that, in the absence of said applied field, said upper and lower energy levels are located each at different energies from layer to layer within said first subset, and so that, in the presence of said applied field, an essentially flatband condition of both said upper and lower minibands exists across adjacent RT regions.

11. The invention of claim 10 wherein the thicknesses of said second subset of said barrier layers decrease from barrier layer to barrier layer in a the direction of said applied field.

12. The invention of claim 11 wherein the thicknesses of said second subset of said barrier layers increase from barrier layer to barrier layer in a the direction of said applied field.

* * * * *